United States Patent [19]
Yoshinaga et al.

[11] Patent Number: 5,618,856
[45] Date of Patent: Apr. 8, 1997

[54] VISIBLE LIGHT SENSITIZER FOR PHOTOPOLYMERIZING INITIATOR AND/OR PHOTOCROSSLINKING AGENT, PHOTOSENSITIVE COMPOSITION, AND HOLOGRAM RECORDING MEDIUM

[75] Inventors: Yoko Yoshinaga, Kawasaki; Naosato Taniguchi, Urawa; Shin Kobayashi, Atsugi, all of Japan

[73] Assignee: Canon Kabushiki Kaisha, Tokyo, Japan

[21] Appl. No.: 491,259

[22] Filed: Jun. 16, 1995

[30] Foreign Application Priority Data

Jun. 20, 1994 [JP] Japan .................................. 6-159611
Apr. 28, 1995 [JP] Japan .................................. 7-127497

[51] Int. Cl.$^6$ .............................. C08F 2/46; G03C 1/68
[52] U.S. Cl. .............................. 522/16; 522/14; 522/17; 522/26; 522/27; 430/2; 430/920; 430/921
[58] Field of Search .................. 522/14, 16, 17, 522/26, 27; 430/2, 920, 921

[56] References Cited

U.S. PATENT DOCUMENTS

| | | | |
|---|---|---|---|
| 3,380,831 | 4/1968 | Cohen et al. | 96/115 |
| 4,147,552 | 4/1979 | Specht et al. | 96/115 R |
| 4,289,844 | 9/1981 | Specht et al. | 430/281 |
| 4,505,793 | 3/1985 | Tamoto et al. | 204/159.16 |
| 4,636,459 | 1/1987 | Kawamura et al. | 430/288 |
| 4,921,827 | 5/1990 | Ali et al. | 502/167 |
| 5,055,372 | 10/1991 | Shanklin et al.1 | 430/138 |
| 5,102,775 | 4/1992 | Okuhara et al. | 430/287 |
| 5,422,204 | 6/1995 | Yoshinaga et al. | 430/2 |

FOREIGN PATENT DOCUMENTS

| | | |
|---|---|---|
| 0022188A3 | 1/1981 | European Pat. Off. |
| 0523715 | 1/1993 | European Pat. Off. |
| 0538997A1 | 4/1993 | European Pat. Off. |
| 2-279702 | 11/1990 | Japan . |
| 6324615 | 11/1994 | Japan . |
| 6329654 | 11/1994 | Japan . |
| 7-281436 | 10/1995 | Japan . |

OTHER PUBLICATIONS

Williams, et al., "Ketocoumarins as Photosensitizers and Photoinitiators," Polym. Eng. & Sci., vol. 23, No. 18, Dec. 1983 pp. 1022–1024.

Specht, et al., "Ketocoumarins," Tetrahedron, vol. 38, No. 9, pp. 1203–1211, 1982.

(List continued on next page.)

*Primary Examiner*—Mark Chapman
*Attorney, Agent, or Firm*—Fitzpatrick, Cella, Harper & Scinto

[57] ABSTRACT

There are disclosed herein a visible light sensitizer for a photopolymerizing initiator and/or a photocrosslinking agent which comprises a thiobarbituric acid derivative compound of the general formula (A) or (B):

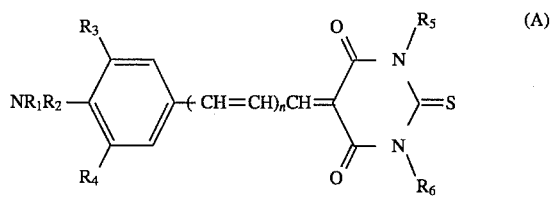

or

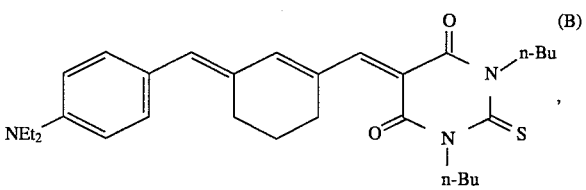

a photopolymerizable and/or a photocrosslinkable composition in which the thiobarbituric acid derivative compound is used, and a hologram recording medium in which the composition is used.

15 Claims, 2 Drawing Sheets

OTHER PUBLICATIONS

Crivello, et al., "Aromatic Bisvinyl Ethers: . . . " J. Polym. Sci., Polym. Chem. Ed., vol. 21, No. 6, pp. 1785–1799 1983.

F.M. Hamer, "The Cyanine Dyes and Related Compounds" (1964) pp. 688–690.

O. Svelto, "Principles of Lasers" Third Ed. (1989) pp. 331–333.

Chem. Abstracts, vol. 114, No. 18, 1991 Ab. No. 165100t, p. 19, based on JPA–02–279,702.

Shoemaker et al., "Experiments in Physical Chemistry" (1981) pp. 412–414.

SPEED : FAST
SLIT : 2.0

VISIBLE LIGHT SENSITIZER FOR PHOTOPOLYMERIZING INITIATOR AND/OR PHOTOCROSSLINKING AGENT, PHOTOSENSITIVE COMPOSITION, AND HOLOGRAM RECORDING MEDIUM

BACKGROUND OF THE INVENTION

1. Field of the Invention

The present invention relates to a novel visible light photosensitizer of thiobarbituric acid series for a photopolymerizable or a photocrosslinkable composition having an excellent thermal stability, a photopolymerizable and/or a photocrosslinkable composition containing a thiobarbituric acid derivative (a coloring matter) and having excellent characteristics which can be sensitized by the thiobarbituric acid derivative compounds, and a hologram recording medium having an excellent reproducibility which is obtained by using the photosensitive composition.

2. Related Background Art

The present inventors have intensively conducted investigations into a sensitizer for a photopolymerizing initiator or a photocrosslinking agent which has excellent photosensitizing properties and in which an absorption maximum is shifted to a long wavelength by elongating or fixing a conjugated double bond of a coumarine derivative and a pyran derivative represented by the following formulae (Japanese Patent Application Nos. 5-144423 and 5-132482).

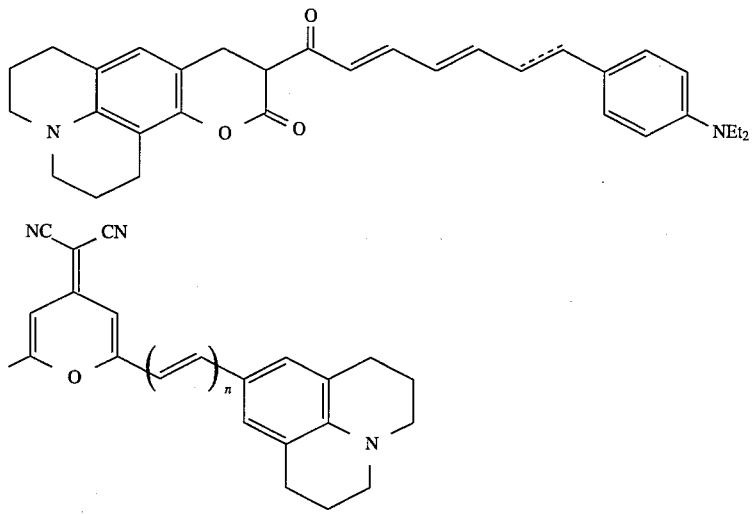

The absorption maximum of each of the abovementioned compounds can be shifted to a long wavelength by elongating its conjugated double bond, and these compounds can sensitize polymerizing initiators and crosslinking agents such as diarylhalonium salts, halomethyl-s-triazines, halogen compounds, bisimidazole derivatives and organic peroxides. Therefore, the above-mentioned compounds can be used as a material for the formation of photosensitive compositions and photosensitive resin compositions.

Since the absorption maximum could be shifted to the long wavelength by the synthesis of a compound in which the conjugated double bond was elongated, it was possible to adjust an absorption maximum in a green region, but it had not been accomplished yet to synthesize a coloring matter with high sensitivity in a red region.

It has been heretofore reported that a thiobarbituric acid derivative, a coloring matter, was used as an analytical reagent for the detection of gold, silver or the like, but this coloring matter has not been used as a sensitizing agent, and it has not also been investigated to shift a sensitizing region to a long wavelength by elongating the conjugated double bond. However, according to the detailed investigation by the present inventors, it is apparent that when the conjugated double bonds are introduced into the thiobarbituric acid derivative having an absorption sensitivity in the red region which can be used as the photosensitizer for the photopolymerizing initiator and/or the photocrosslinking agent, the high-sensitive coloring matter can be obtained which is particularly useful in the red region (Japanese Patent Application No. 6-87271).

On the other hand, various kinds of the sensitizing agents having the sensitivity in the red region are known, but a higher sensitivity, the improvement of fading properties by light irradiation and the like have been desired for the sake of the preparation of a hologram having an excellent transparency. In order to improve the transparency of the hologram, it is important that the sensitizing agent can easily be removed by a solvent or the like as one of the characteristics of the sensitizing agent, but if the sensitizing agent is excellent in photofading properties, a step of removing the sensitizing agent by a solvent can be omitted. Therefore, it is more important from the viewpoint of the simplification of the manufacturing process of the hologram that the sensitizing agent is excellent in photofading properties.

Heretofore, various kinds of hologram recording media have been reported, but their sensitivity is much lower as compared with that of a bleached silver salt hologram sensitive material, and therefore it has been desired to develop a photopolymeric hologram recording medium having a higher sensitivity.

On the contrary, the coloring matter of thiobarbituric acid derivatives which has been suggested by the above-mentioned present inventors is excellent in photoreactivity and particularly photofading properties, and so this coloring matter is useful as a material for forming the hologram recording medium, but it has the following two drawbacks:

(1) Its solubility in an organic solvent is low.

(2) Its thermal stability is poor as a photosensitive solution (a dark reaction easily proceeds).

SUMMARY OF THE INVENTION

Thus, objects of the present invention are to provide a stable thiobarbituric acid type coloring matter, high in a practical use, having an excellent photoreactivity, particularly excellent photofading properties and a high absorption sensitivity in a red region which can overcome the above-mentioned drawbacks, a photopolymerizable or a photocrosslinkable composition having excellent characteristics in which the thiobarbituric acid type coloring matter is used as a photosensitizer, and a hologram recording medium in which the photosensitive composition is used.

The above-mentioned objects can be achieved the following invention.

According to the present invention, there is thus provided a visible light sensitizer for a photopolymerizing initiator and/or a photocrosslinking agent which comprises a thiobarbituric acid derivative compound of the following general formula (A) or (B):

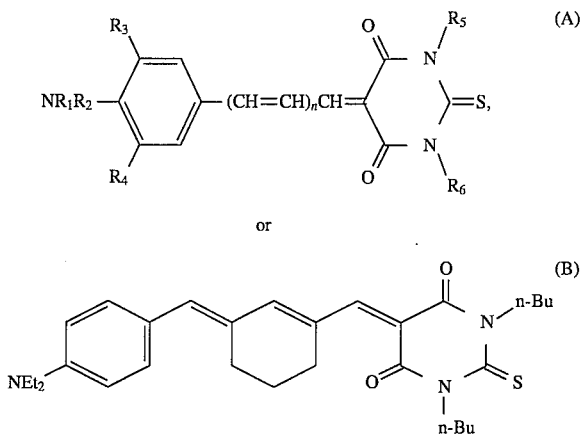

wherein each of $R_1$ and $R_2$ is alkyl having 1 to 6 carbon atoms; each of $R_3$ and $R_4$ is hydrogen or alkyl having 1 to 6 carbon atoms; and $R_1$ and $R_3$ or $R_2$ and $R_4$ may be bonded to each other to form a five-, six- or seven-membered heterocycle; each of $R_5$ and $R_6$ is independently a long-chain alkyl group having 2 or more carbon atoms; and n is an integer of 0 to 3.

According to the present invention, there is also provided a photopolyerizable and/or a photocrosslinkable composition which comprises a visible light sensitizer for a photopolymerizing initiator and/or a photocrosslinking agent comprising a thiobarbituric acid derivative compound represented by the general formula (A) or (B) mentioned above, and at least one polymerization initiator or crosslinking agent selected from the group consisting of polymerization initiators which can be activated by the irradiation of active rays and crosslinking agents which can be activated by the irradiation of the active rays.

According to the present invention, there is provided further a hologram recording medium which mainly comprises a photopolymerizable and/or a photocrosslinkable composition comprising a visible light sensitizer for a photopolymerizing initiator and/or a photocrosslinking agent which comprises a thiobarbituric acid derivative compound represented by the general formula (A) or (B) mentioned above, and at least one photopolymerizing initiator or crosslinking agent selected from photopolymerizing initiators which can be activated by the irradiation of active rays and crosslinking agents which can be activated by the irradiation of active rays.

DETAILED DESCRIPTION OF THE PREFERRED EMBODIMENTS

Figure 1:
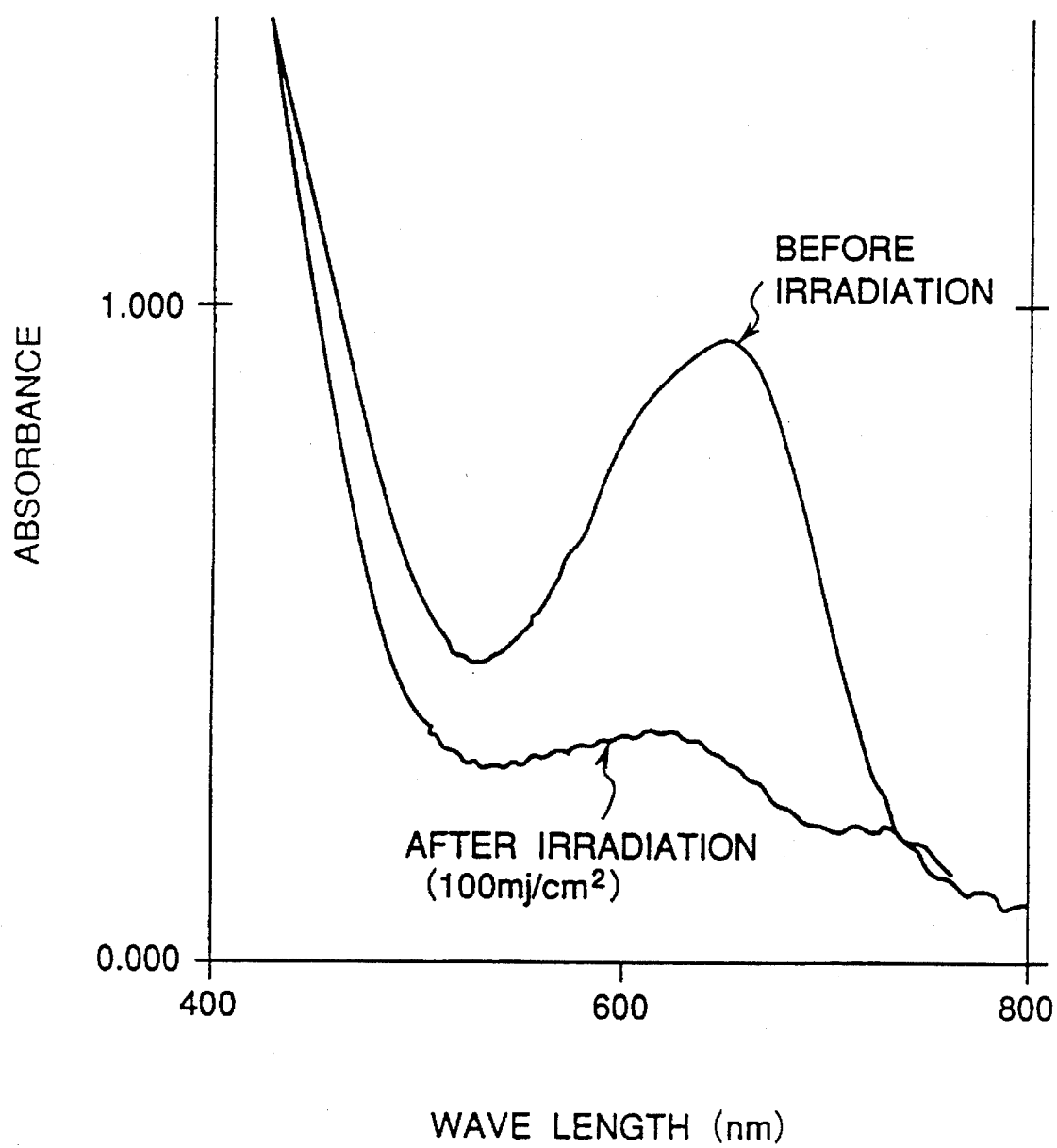
FIG. 1 is a spectrum showing the fading state of a coloring matter in a photosensitive film, in the case that the photosensitive film comprising a photosensitive resin composition containing a visible light sensitizer obtained in Example 3 is exposed to light.

The present inventors have intensively researched with the intention of solving the above-mentioned conventional technical problems, and as a result, it has been found that when a saturated long-chain alkyl group is introduced into the thiobarbituric acid ring of a thiobarbituric acid type coloring matter having excellent photoreactivity and practically excellent photofading properties which has already been suggested by the present inventors, the improvement of its solubility in an organic solvent and the improvement of its thermal stability as a photosensitive solution can be accomplished, thereby obtaining a practically valuable coloring matter. In consequence, the present invention has been attained.

That is to say, when an unsubstituted compound in which the thiobarbituric acid ring has no substituent, or a methyl-substituted or a phenyl-substituted compound is dissolved in an aromatic solvent having a low polarity, the compound cannot be dissolved to a concentration of about $10^{-1}\%$ by weight which is most suitable for a hologram photosensitive liquid. Furthermore, when a solvent such as an ether is used, such the compound is dissolved therein to such a degree as to slightly color the solution, but its solubility is further lower than in the aromatic solvent. Moreover, this compound does not exhibit any solubility in a hydrocarbon solvent such as hexane. Therefore, when a coloring matter of thiobarbituric acid series is used as the sensitizer to prepare a photosensitive composition, the coloring matter of thiobarbituric acid series is required to be dissolved in an organic solvent in compliance with the solubility properties of a monomer or a polymer to be used. However, the solubility of this kind of thiobarbituric acid type coloring matter is poor, and for this reason, its handling is difficult.

On the contrary, if a long-chain alkyl group is introduced to the thiobarbituric acid ring to form a compound having a double bond fixed with the saturated hydrocarbon group, the thus formed compound can be dissolved $10^{-1}\%$ by weight or more in the aromatic solvent, and it is also soluble in a hydrocarbon solvent such as hexane. In addition, owing to the introduction of the long-chain alkyl group, the thiobarbituric acid compound is also soluble in solvents such as alcohols, petroleum ethers, ketones, aliphatic hydrocarbons and chlorinated hydrocarbons, and thus the solubility of the compound in various kinds of organic solvents can be improved.

Furthermore, the thermal stability of the photosensitive solution can also be improved by introducing the long-chain alkyl group into the thiobarbituric acid ring, as described above. That is to say, the poor thermal stability is considered to be due to an interaction of an amino group of the thiobarbituric acid ring and a halogen compound in a ground state. Judging from a fact that when emission spectra of the compound having the introduced long-chain alkyl group and the unsubstituted compound are measured and compared, any difference is not observed between these spectra, it can be supposed that the improvement of the thermal stability of the compound can be achieved by introducing the long-chain alkyl group into the thiobarbituric acid ring to inhibit the interaction in a ground state without lowering the photoreactivity.

Next, the present invention will be described in more detail with reference to preferred embodiments.

A visible light sensitizer according to the present invention is characterized by comprising a thiobarbituric acid derivative compound of the general formula (A) or (B):

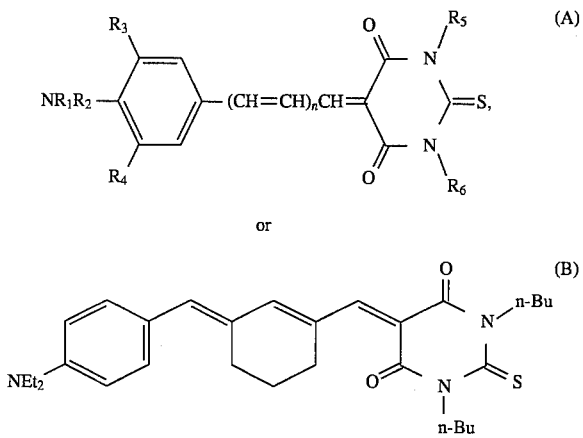

wherein each of $R_1$ and $R_2$ is alkyl having 1 to 6 carbon atoms; each of $R_3$ and $R_4$ is hydrogen or alkyl having 1 to 6 carbon atoms; and $R_1$ and $R_3$ or $R_2$ and $R_4$ may be bonded to each other to form a five-, six- or seven-membered heterocycle; each of $R_5$ and $R_6$ is independently a long-chain alkyl group having 2 or more carbon atoms; and n is an integer of 0 to 3.

The visible light sensitizer according to the present invention comprises a thiobarbituric acid derivative in which the long-chain alkyl group is introduced into the thiobarbituric acid ring, but this thiobarbituric acid derivative can be synthesized from, for example, thiobarbituric acid and a corresponding aldehyde in accordance with the following process:

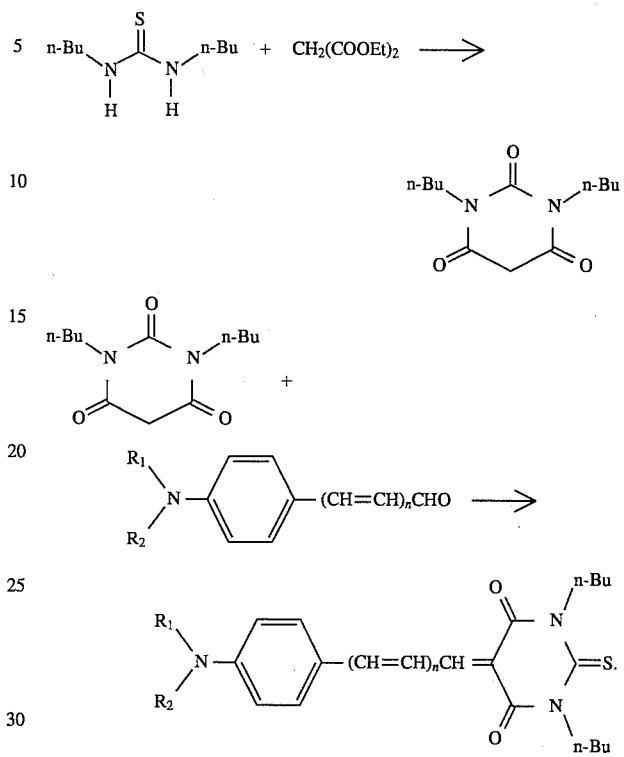

The aldehyde used in this process can be synthesized in accordance with the following typical synthetic route:

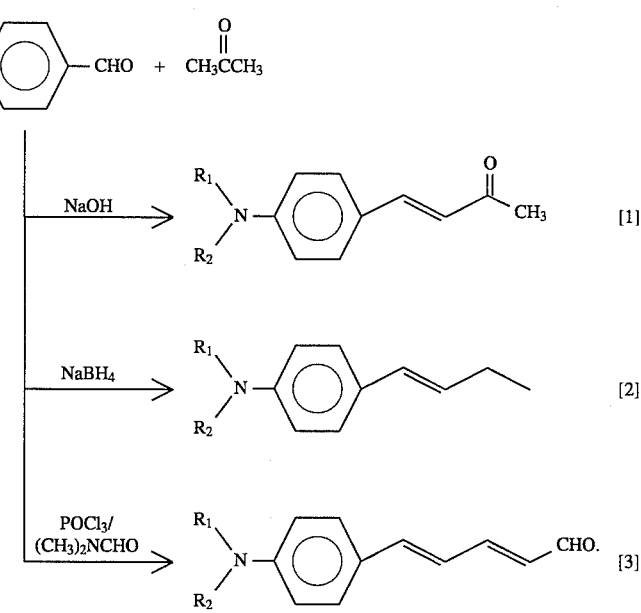

In order to further increase the number of double bonds, the compound obtained in the above-mentioned reaction [3] is repeatedly subjected to the reactions [1] and [2].

Even in a case of a julolidinyl-substituted compound having a ring closure structure at a nitrogen atom, the same synthetic method as described above can be used, but in this case, purification is necessary in the respective steps in order to increase a reaction yield.

As the thiobarbituric acid derivative for constituting the visible light sensitizer according to the present invention which can be synthesized by the above-mentioned process, compounds having the following structural formulae can be preferably used. In all of the examples enumerated here, n-butyl is introduced as the long-chain alkyl group, but the present invention is not limited to these compounds. Any compound can be preferably used, so long as it has a saturated hydrocarbon having 2 or more carbon atoms, preferably 10 or less carbon atoms. In particular, the compounds into which n-butyl is introduced are particularly preferable, because they are excellent in solubility in the organic solvent and excellent in thermal stability in the case of a photosensitive solution.

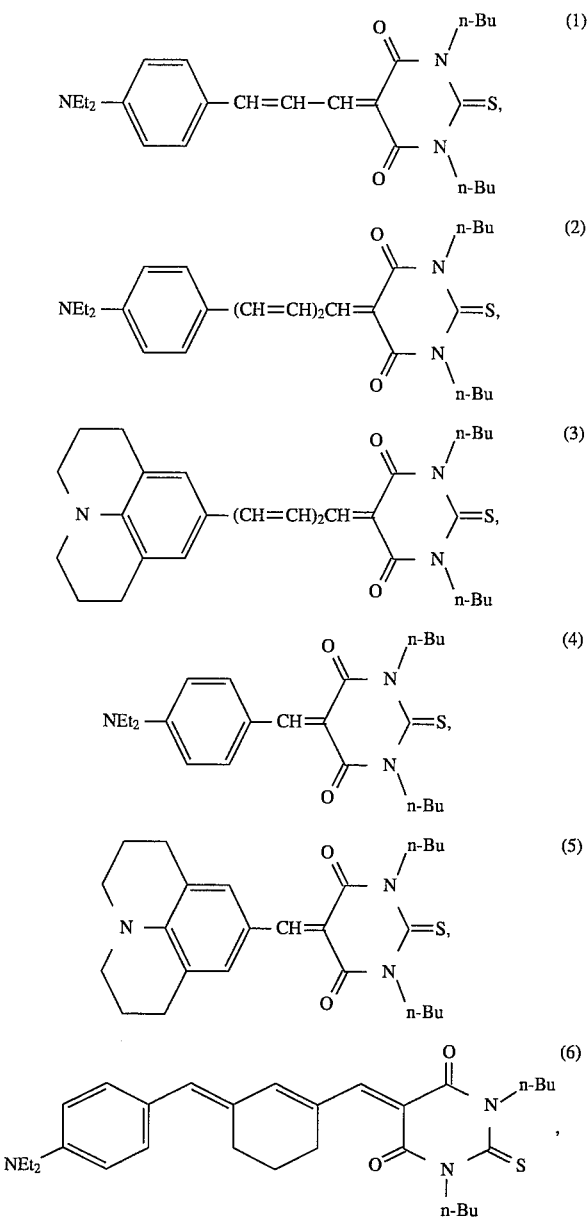

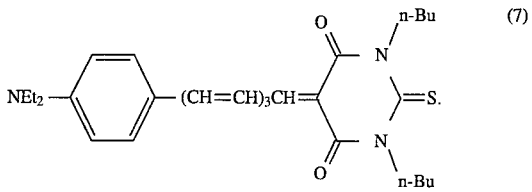

The absorption maximum of the above-mentioned thiobarbituric acid derivative compound can be shifted to a long wavelength in compliance with the double bonds and the substituent and the compound exerts excellent photosensitizing properties, and so the compound can be utilized as a visible light sensitizer (a sensitizing coloring matter) in a red region for a photopolymerizing initiator or a photocrosslinking agent. The absorption maximum and the sensitizing wavelength region of the compound depend upon the kind of medium for film formation or solvent of a photosensitive solution for coating, and in a certain case, the absorption maximum is in the vicinity of about 700 nm. In particular, the compound having an n of 2 or more is largely influenced by the coating solvent, and its absorption maximum is shifted as much as about 50 nm to the long wavelength in compliance with the polarity of the solvent.

In addition, the above-mentioned thiobarbituric acid derivative compound has a high solubility in an organic solvent, and the photosensitive solution using this compound is excellent in thermal stability. Therefore, a photosensitive composition and a hologram medium prepared from the photosensitive solution have excellent characteristics.

Typical examples of the photopolymerizing initiator and the photocrosslinking agent which can be sensitized by the above-mentioned thiobarbituric acid derivative compound include diarylhalonium derivatives, bisimidazole derivatives, triazine derivatives, halogen compounds and peroxides. Above all, the thiobarbituric acid derivative compound has a high reactivity with the halogen compound. The detail of this cause is not definite, but one cause of having the higher reactivity with the halogen compound than with the other compounds can be considered to be that the thiobarbituric acid derivative compound exerts a strong interaction with the halogen compound in a ground state. Furthermore, a reaction mechanism between the thiobarbituric acid derivatives and the photopolymerizing initiator or the photocrosslinking agent is supposed to be due to the electrons or energy transfer from a triplet state or a singlet state, judging from a fact that the polymerization initiator or the like to be sensitized has an electron accepting group.

A photopolymerizable composition according to the present invention comprises the above-mentioned thiobarbituric acid derivative compound, the polymerization initiator and a polymerizable compound such as a monomer. Also, a photocrosslinkable composition according to the present invention comprises the thiobarbituric acid derivative compound, a crosslinking agent and a polymer as essential components.

In these cases, an active additive, a binder polymer and a plasticizer can be suitably added to the photosensitive composition in compliance with conditions. If one or more kinds of coloring matters are added, multiple recording in one layer recording medium is possible with one or more kinds of recording wavelengths.

Of the above-mentioned compositions, the photosensitive composition comprising the thiobarbituric acid derivative compound, the crosslinking agent and a polymer mainly composed of carbazole is particularly preferably used as a volume phase hologram recording medium.

In this case, the concentration of the thiobarbituric acid derivative compound for constituting the visible light sensitizer according to the present invention can be adjusted in compliance with the film thickness of the volume phase hologram recording medium and exposure wavelength, and the compound can be used in the concentration range of $10^{-3}$ to $10^0\%$ by weight, preferably $10^{-2}$ to $10^{-1}\%$ by weight based on the weight of the photosensitive solution. The thiobarbituric acid derivative compound which can be used in the present invention is more excellent in solubility in the organic solvent as compared with a conventional compound, and so the photosensitive solution in the above-mentioned concentration range can easily be prepared.

The diarylhalonium salt derivatives and the like which can be used as the photopolymerizing initiator or the photocrosslinking agent will be described in detail as follows.

Diarylhalonium Salt Derivatives

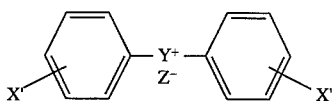

wherein X is alkyl or halogen; Y is I, Br or Cl; and Z is $PF_6$, $CF_3COO$, $ClO_4$, $CbF_6$ or $AsF_6$.

Bisimidazole Derivatives

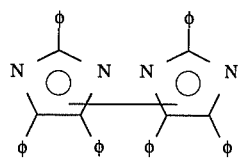

wherein φ is an aryl radical.

Halogen Compounds $CI_4$, $CHI_3$, $CBrCl_3$ and the like.

Halomethyl-s-triazines

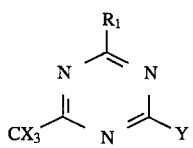

wherein X is halogen, preferably chlorine; Y is $CH_3$, $NH_2$, NHR, OR, SR (R: alkyl or aryl), alkyl or aryl; and $R_1$ is trihalomethyl, alkyl or aryl.

Organic Peroxides

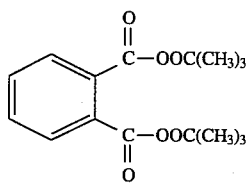

and

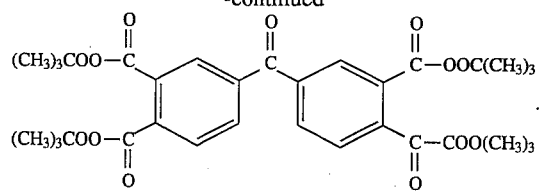

The above-mentioned photopolymerizing initiator or photocrosslinking agent can be used at a concentration preferably in the range of $10^{-2}\%$ to $10^1\%$ by weight, more preferably $10^{-1}$ to $10^0\%$ by weight based on the weight of the photosensitive solution.

A polymerizable compound which can be used in a photopolymerizable composition according to the present invention is a compound having at least one double bond, and examples of the compounds include a monomer, prepolymers such as a dimer and an oligomer, and a mixtures thereof.

Typical examples of the polymerizable compounds include 1,5-pentanediol diacrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxy ethylate, trimethylolpropane triacrylate or trimethacrylate, compounds similar to those as mentioned in U.S. Pat. No. 3,380,831, pentaerythritol tetraacrylate, triethylene glycol diacrylate, triethylene glycol dimethacrylate, polyoxypropyltrimethylolpropane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, pentaerythritol tetramethacrylate, trimethylolpropane trimethacylate, 1,5-pentanediol dimethacrylate and diallyl fumarate.

Further examples of the polymerizable compounds include styrene, 2-chlorostyrene, phenyl acrylate, 2-phenyl ethyl acrylate, 2,2'-di(p-hyroxyphenyl)propane diacrylate and methacrylate, 1,4-phenylene diacrylate and methacrylate, 1,4-diisopropenylbenzene and 1,3,5-triisopropenylbenzene. The examples of the monomers which can be used in the present invention are not limited to the above-mentioned radically polymerizable monomers.

Examples of a polymer mainly constituting the photocrosslinkable resin composition according to the present invention include polyvinylcarbazole, poly(3-chlorovinylcarbazole), poly(3-bromovinylcarbazole), poly(3-iodovinylcarbazole), poly(3-methylvinylcarbazole), poly(3-ethylvinylcarbazole), chlorinated polyvinylcarbazole and brominated polyvinylcarbazole.

Furthermore, further examples of the crosslinkable polymer include a polystyrene having halogen (Cl, Br or I), amino, dimethylamino or methoxy at the p-position, poly(N-vinylindole), poly(N-vinylpyrrole), poly(N-vinylphenothiazine), poly(isopropenylphenol) and poly[4-(N,N-diphenylamino)phenylmethyl methacrylate].

As the above-mentioned vinylcarbazole type polymer, there is used, for example, a copolymer or a blended polymer including vinylcarbazole monomer, as needed for controlling characteristics such as strength and flexibility in the case that films are formed.

For example, there can also be used copolymers and blended polymers of the above-mentioned vinylcarbazoles with olefins, vinyl esters such as vinyl acetate and the like, esters of acrylic acid and methacrylic acid such as methyl methacrylate, styrene, acrylonitrile, or the like.

In addition, the crosslinkable polymer can be blended with another polymer such as polystyrene, styrene-butadiene copolymer, styrene-hydrogenated butadiene copolymer, polycarbonate, polyacrylate, polyvinylbutyral or polyvinyl acetate. The amount of these monomers and polymers should be regulated so as to obtain desired characteristics.

The photocrosslinkable resin composition according to the present invention can be obtained by dissolving the above-mentioned necessary components in a suitable solvent at once or in turn.

In view of the solubility of the polymer having an aromatic group on its side chain, the sensitizer or the crosslinking agent and the boiling point of the solvent, as a preferable organic solvent which can be used in the formation of the composition, there can be most preferably used benzene, xylene, chlorobenzene, chloroform, dichloroethane, dichloroethylene, trichloroethylene, pyridine, dioxane, tetrahydrofuran and mixtures thereof. In the case that the polymer having a hydrophylic group such as a styrene having —OH at the p-position is used, methanol, ethanol or the like can be preferably used. The thiobarbituric acid derivative compound constituting the visible light sensitizer according to the present invention is more soluble in the organic solvent as compared with the conventional compounds, and therefore the thiobarbituric acid derivative compound can be dissolved in any of the above-mentioned various kinds of organic solvents. Thus, the photosensitive composition having a predetermined concentration can easily be prepared.

The photocrosslinkable composition according to the present invention thus obtained is suitably made up such that the viscosity of an obtained solution is in the range of from 50 to 5,000 cP, preferably from 300 to 2,000 cP at 20° C., though the viscosity varies with the concentration and molecular weight of the polymer.

As a technique for dissolving the polymer used, there can be used a usual dissolving operation which comprises adding the polymer to the organic solvent, heating it if necessary, filtering the solution to remove insolubles, and then allowing it to stand to remove air bubbles, but no particular limitation is put thereto.

The photocrosslinkable resin composition according to the present invention thus obtained has a sensitivity in a visible light region. Therefore, it is preferably stored in a dark place.

Next, a photosensitive medium for hologram recording according to the present invention will be described. This hologram recording medium can be obtained by forming a film of the photosensitive composition according to the present invention on a suitable substrate such as a glass plate or a plastic film. Additionally, the hologram recording medium can be exposed to coherent light to record interference fringes, whereby the excellent hologram can be prepared.

Now, a method for preparing the hologram according to the present invention will be described with reference to an embodiment in which the hologram recording medium using the photocrosslinkable resin composition is employed.

In the first place, a latent image for a volume phase type hologram is recorded on the photosensitive recording medium for the hologram with reference beam and object beam from laser which is coherent visible light in the photosensitive region of the photosensitizer according to the present invention.

Afterward, the thus formed latent image can be subjected to a development step utilizing a swelling and shrinking phenomenon by a solvent which will be described hereinafter, to form the volume phase type hologram having a high resolution and a high diffraction efficiency.

That is to say, after the above-mentioned exposure step, the hologram recording medium is immersed in a solvent (the first solvent) which does not dissolve the polymer used in the recording medium composition and a crosslinked polymer produced by a photoreaction, to substantially completely dissolve and remove the sensitizer and the unreacted and decomposed crosslinking agent from the recording medium, thereby eliminating a color. This step can serve also for the following swelling step.

The subsequent development process comprises the following swelling step and shrinking step.

That is to say, the hologram latent image is formed by the above-mentioned exposure step, and the sensitizer and the unreacted and decomposed crosslinking agent are removed from the recording medium by the above-mentioned swelling step. Next, in the swelling step of the hologram recording medium, the thus obtained recording medium is treated with a swelling solution using the first solvent to cause swelling in compliance with a formed hologram pattern. Afterward, a shrinking treatment using the second solvent is carried out to shrink the above-mentioned swollen hologram recording medium, thereby amplifying and fixing the hologram.

Typical examples of the swelling solution, i.e., the first solvent which can be used in the above-mentioned hologram development step, include benzene and naphthalene derivatives such as benzene, toluene, xylene (the ortho-isomer, meta-isomer, para-isomer and mixtures thereof), ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene, halogenated saturated and unsaturated hydrocarbons such as dichloromethane, chloroform, trichloroethylene, trichloroethane, dichloroethane and bromoform, ketones such as acetone, methyl ethyl ketone, methyl isobutyl ketone and cyclohexanone, esters such as ethyl acetate and ethyl formate, amines, and amides.

Particularly in the case that polyvinylcarbazole or its derivative is used as the polymer, as the swelling solution there is preferably used benzene and naphthalene derivatives such as benzene, toluene, xylene (the ortho-isomer, meta-isomer, para-isomer and mixtures thereof), ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene.

Furthermore, as a shrinking solution, the second solvent, any solvent can be used, so long as it neither swells nor dissolves the hologram recording medium and it is compatible with the above-mentioned swelling solution. Examples of the preferably usable shrinking solution include alkanes and cycloalkanes such as n-pentane, n-hexane, n-heptane, n-octane, isooctane and cyclohexane, alcohols such as methyl alcohol, ethyl alcohol, n-propyl alcohol, isopropyl alcohol, n-butyl alcohol, tert-butyl alcohol, n-amyl alcohol and isoamyl alcohol, and ethers such as diethyl ether, methyl ethyl ether and diisopropyl ether.

Above all, the saturated hydrocarbons having 5 to 7 carbon atoms are excellent in a shrinking effect, and so they can suitably be used in the shrinking step singly or as a mixture of two or more thereof, or a mixture of the saturated hydrocarbon with another solvent.

The treatment conditions of temperature, time and the like in the respective steps depend upon the kind of recording medium to be used and the kind of solvent, and so it is impossible to sweepingly decide the conditions. However, usually in every step, the treatment can be carried out at a temperature of about 10° to 70° C. for a period of several seconds to several minutes, whereby a sufficient effect can be exerted.

Next, the present invention will be described in detail with reference to examples, but the scope of the present invention should not be limited to these examples.

EXAMPLES 1 to 7

A mixed solution of 0.01 mol of a corresponding aldehyde obtained by the following usual process, 0.01 mol of thiobarbituric acid having two n-butyl groups and 3 cm³ of ethanol was heated at 75° C. for 2 hours. The precipitated solid was collected by filtration, and then recrystallized from acetone to obtain a blue solid.

A process for synthesizing an aldehyde having three double bonds (in the general formula (A), n=3) is shown as follows.

Synthesis of 7-(p-diethylaminophenyl)-2,4,6-heptatrienal

DMF (10.8 g) was cooled to 10° C. or less, and POCl₃ (10.8 g) was added dropwise thereto, while 10° C. or less was maintained, and the solution was then cooled at 0° C. for 30 minutes.

Afterward, a solution of 6-(p-diethylaminophenyl)-2-hydroxy-3,5-hexadiene (14 g) in DMF (27 g) was added dropwise thereto at 0° C. over 2 hours.

Next, reaction was carried out at 50° C. for 2 hours. After the reaction, the reaction product was cooled to 0° C., and a solution of sodium acetate (32 g) in water (77 ml) was added dropwise thereto at 10° C. After the addition, the solution was stirred at room temperature for 1 hour.

Afterward, water of from 200 to 300 ml was added thereto, and an aqueous phase was washed with 500 ml of ether and a dilute sodium hydroxide solution was then added at 10° C. or less to make the solution alkaline. The precipitated crystals were collected by filtration under reduced pressure, washed with water, and extracted with CHCl₃. The extract was dried over MgSO₄, and then purified through a column to obtain 7-(p-diethylaminophenyl)-2,4,6-heptatrienal. At this time, yield was 18.5%.

The thus synthesized product was identified by proton NMR. The results of NMR measurement are shown in Table 1. Also, the above-mentioned synthetic procedure was carried out while purification was sufficiently done in every reaction step, to obtain 7 julolidinyl-2,4,6-heptatrienal.

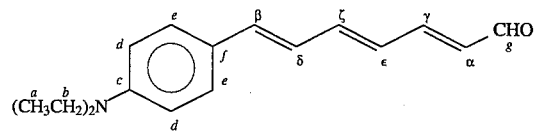

Thiobarbituric acid derivatives shown in Table 3 were prepared by the above-mentioned synthetic process.

The structures of compounds shown in Table 3 were identified by ¹H-NMR. The results are shown in Table 2. Moreover, the absorption maxima of the obtained coloring matters in a chloroform solution are shown in Table 3. As a result, it was confirmed that every compound had the absorption maximum in a red region of about 500 to 700 nm, and the compounds having n=2 and n=3 in the formula (A) had the absorption maximum on a longer wavelength.

EXAMPLE 8A

In 300 ml of chlorobenzene were dissolved 3 g of PVCz (polyvinyl carbazole), 0.1 g of carbon tetraiodide and 0.01 g of a sensitizer obtained in Example 3 to obtain a photosensitive resin composition according to the present invention. In this case, the solubility of the used sensitizer in chlorobenzene was good.

Figure 2:
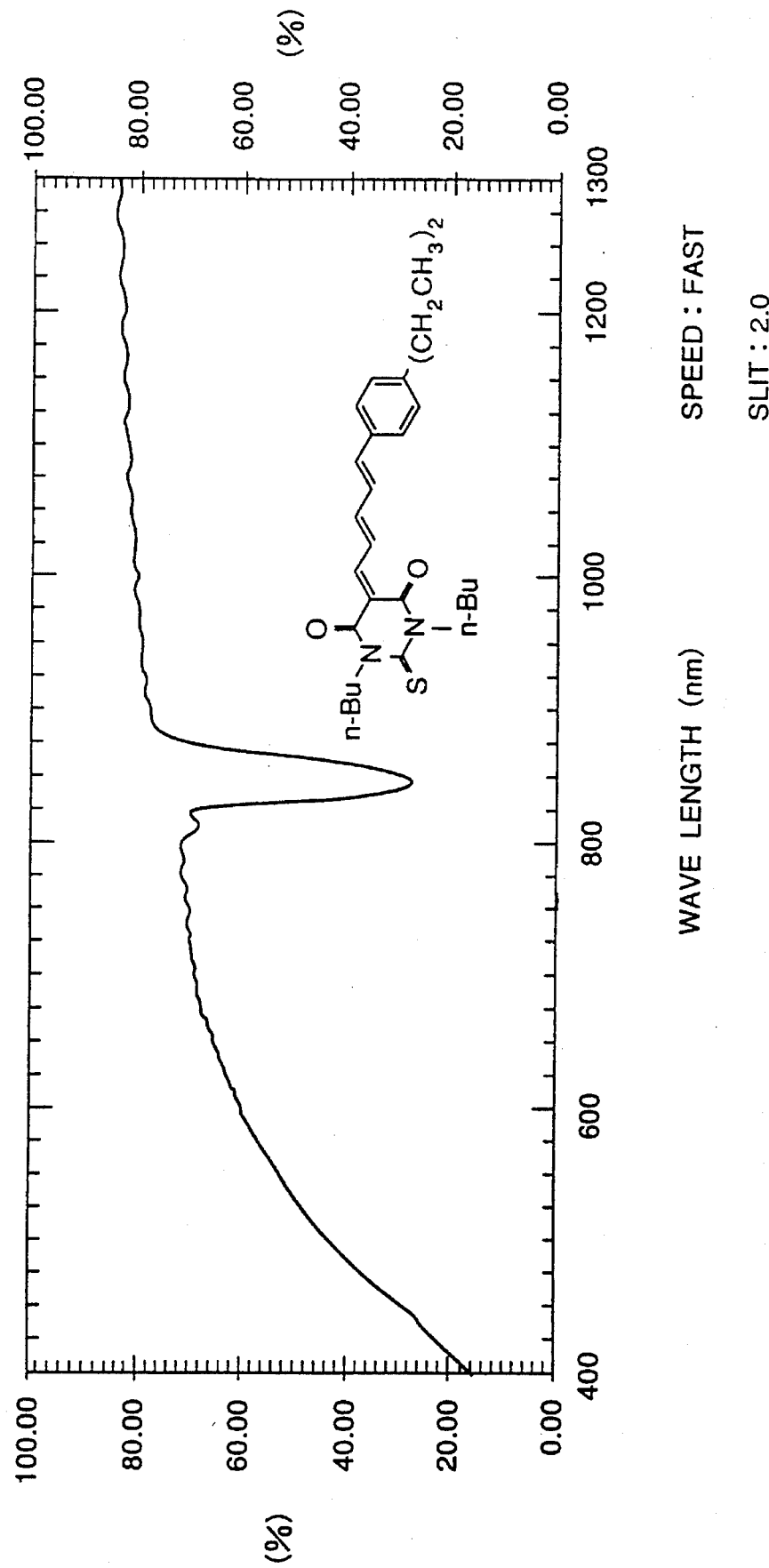
FIG. 2 is a diagram showing the diffraction efficiency of a hologram recording medium in which the visible light sensitizer obtained in Example 3 is used.

Afterward, a glass substrate was coated with this composition solution so as to have a film thickness of 10 μm, to obtain a hologram recording medium of the present invention. Next, the thus obtained recording medium was exposed at 100 mJ/cm² with a krypton laser (647.1 nm). As a result, the fading of the coloring matter occurred promptly, as shown in FIG. 1. In addition, as shown in FIG. 2, the diffraction efficiency of the hologram was high.

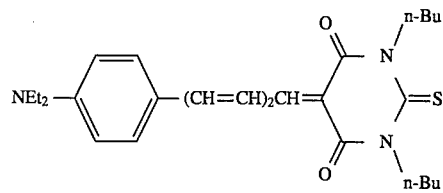

EXAMPLES 8B 3 g of PVCz and 0.01 g of a sensitizer obtained in Example 1 were dissolved in 30 ml of chlorobenzene to obtain a photosensitive resin composition of the present invention. Afterward, a glass substrate was coated with this photosensitive solution so as to have a film thickness of 10 μm, followed by drying. Next, the thus obtained recording medium according to the present invention was exposed at 100 mJ/cm² with a krypton laser (647.1 nm). In this case any fading of the coloring matter was: not observed, whereby it was confirmed that the recording medium was stable.

COMPARATIVE EXAMPLE 1

3 g of PVCz, 0.1 g of carbon tetraiodide and 0.01 g of a sensitizer having no butyl group were dissolved in 30 ml of cyclohexane to obtain a photosensitive resin composition for comparison. Afterward, a glass substrate was coated with this photosensitive solution for comparison so as to have a film thickness 10 μm, followed by drying, to obtain a recording medium for comparison.

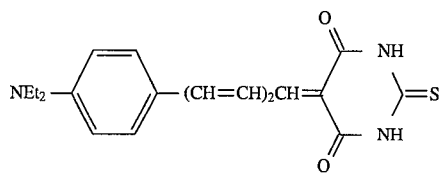

Next, the thus obtained recording medium was allowed to stand at room temperature for one week, and after the storage, the recording medium was exposed at 100 mJ/cm² with a krypton laser (647.1 nm). As a result, any change was not observed between absorption spectra before and after the exposure, and a dark reaction proceeded, which meant that the recording medium was Door in stability.

EXAMPLE 9

3 g of PVCz, 0.1 g of di-t-butyldiphenyliodonium hexafluorophosphate and 0.01 g of a sensitizer having the following formula obtained in Example 1 were dissolved in 30 ml of chlorobenzene to obtain a photosensitive resin composition of the present invention. In this case, the solubility of the used sensitizer in chlorobenzene was good.

Afterward, a glass substrate was coated with this photosensitive solution so as to have a film thickness of 2 μm to obtain a recording medium of the present invention. Next, the recording medium was exposed at 100 mJ/cm² with an argon laser of 514.5 nm, heated at about 120° C. for one minute, and then developed with dichloromethane to remove an unexposed portion, thereby obtaining a relief pattern. As a result, the recording medium was excellent in thermal stability, and on the obtained relief pattern, the negative image of a mask was successfully reproduced.

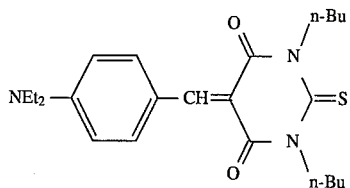

EXAMPLE 10

The same procedure as in Example 9 was carried out except that a sensitizer was replaced with a compound having the following formula and a krypton laser wavelength of 647.1 nm was used at the exposure of a hologram recording medium, to obtain a relief pattern on the hologram recording medium. As a result, the solubility of the used sensitizer in chlorobenzene was good, and the recording medium was excellent in thermal stability, and on the obtained relief pattern, the negative image of a mask was successfully reproduced, as in Example 9.

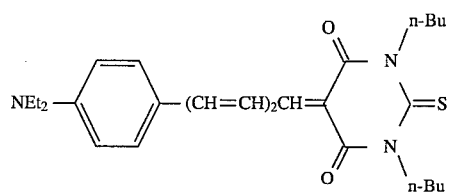

EXAMPLE 11

The same procedure as in Example 9 was carried out except that a sensitizer was replaced with a compound having the following formula and a semiconductor laser wavelength was used at the exposure of a hologram recording medium, to obtain a relief pattern on the hologram recording medium. As a result, the solubility of the used sensitizer in chlorobenzene was good, and the recording medium was excellent in thermal stability, and on the obtained relief pattern, the negative image of a mask was successfully reproduced, as in Example 9.

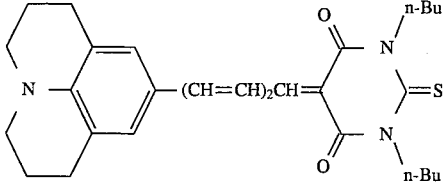

EXAMPLE 12

0.01 g of a sensitizing dye having the following formula, 5.0 g of vinylcarbazole, 0.5 g of bis(t-butylphenyl)iodonium hexafluorophosphate and 0.1 g of iodoform were dissolved in 60 cm³ of toluene to obtain a photosensitive solution for a volume phase type hologram recording medium of the present invention. At this time, the solubility of the used sensitizer in toluene was good.

Afterward, a glass substrate was spin-coated with the thus obtained photosensitive solution to obtain a hologram recording medium having a film thickness of 10 μm.

The thus obtained recording medium was subjected to a two-beam coherent laser exposure treatment by the use of the light of a helium neon laser. An exposure was 100 mJ/cm². The exposed recording medium was developed with xylene and hexane to obtain a reflection type volume phase hologram. The diffraction efficiency of the obtained hologram was about 75%.

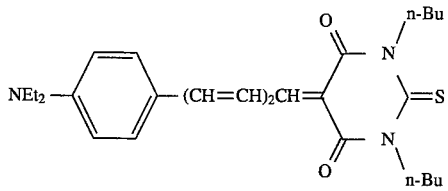

EXAMPLE 13

0.01 g of the total of two sensitizing dyes represented by the following formulae, 5.0 g of vinylcarbazole, 0.5 g of bis(t-butylphenyl)iodonium hexafluorophosphate and 0.1 g of iodoform were dissolved in 60 cm³ of toluene to obtain a photosensitive solution for a volume phase type hologram recording medium of the present invention. At this time, the solubility of the used sensitizers in toluene was good.

Afterward, a glass substrate was spin-coated with the thus obtained photosensitive solution to obtain a hologram recording medium having a film thickness of 10 μm. The thus obtained hologram recording medium was subjected to a two-beam coherent laser exposure treatment by the use of helium neon laser beams. An exposure was 100 mJ/cm², The exposed recording medium was further subjected to the two-flux coherent exposure treatment by an argon laser of 514 nm and then 488 nm, whereby multiple recording was given to the one-layer recording medium by the two kinds of recording wavelengths.

Next, this recording medium was developed with xylene and hexane to obtain a reflection type volume phase hologram having three colors of blue, green and red. The diffraction efficiency of the obtained hologram was about 75%.

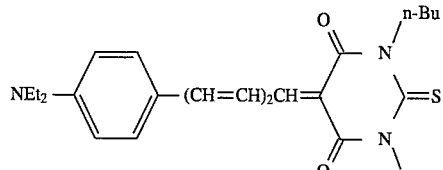

and

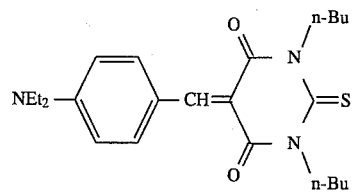

As described above, according to the present invention, a specific thiobarbituric acid derivative is used to obtain a visible light sensitizer for a photopolymerizing initiator and/or a photocrosslinking agent having excellent characteristics, i.e., having a high sensitivity in the visible light region of from blue to red, showing excellent sensitizing properties, and having an improved solubility in an organic solvent and an improved thermal stability in the case of a photosensitive solution.

Furthermore, according to the present invention, the above-mentioned sensitizer having the excellent characteristics is used, thereby obtaining a photosensitive composition having excellent properties and a hologram recording medium mainly comprising the composition.

TABLE 1

| δ (ppm) | Proton | Position | Coupling constant |
|---|---|---|---|
| 1.18 | t | —CH₃ | a | 7 Hz |
| 3.39 | q | —CH₂— | b | 7 Hz |
| 6.13 | q | —CH | α | 15 Hz, 8 Hz |
| 6.45 | q | —CH | ε | 15 Hz, 11 Hz |
| 6.69 | q | —CH | δ | 15 Hz, 10 Hz |
| 6.74 | d | —CH | β | 14 Hz |
| 6.63 7.32 | dd | —CH | d, e | 9 Hz |
| 6.83 | q | —CH | ζ | 15 Hz, 10 Hz |
| 7.18 | q | —CH | γ | 15 Hz, 12 Hz |
| 9.55 | d | —CHO | g | 8 Hz |

TABLE 2

| | BTB-E-D1 | BTB-E-D2 | BTB-E-D3 | BTB-E-D4 | BTB-E-D3Anc | BTB-J-D1 | BTB-J-D3 |
|---|---|---|---|---|---|---|---|
| | ¹H chemical shift/ppm in CDCl₃ | | | | | | |
| z | — | — | — | — | — | 2.79 t | 2.74 t |
| a | 1.26 t | 1.24 t | 1.22 t | 1.22 t | 1.22 t | 1.99 m | 1.97 m |
| b | 3.51 q | 3.47 q | 3.44 q | 3.41 q | 3.45 q | 3.39 t | 3.29 t |
| a' | 0.97 t | 0.97 q | 0.97 m | 0.99 m | | 0.97 m | 0.96 m |
| b' | 1.41 m | 1.41 m | 1.40 m | 1.42 m | 1.40 m | 1.41 m | 1.40 m |
| c' | 1.73 m | 1.72 m | 1.71 m | 1.73 m | 1.72 m | 1.73 m | 1.70 m |
| d' | 4.50 m | 4.47 m | 4.46 m | 4.45 m | 4.46 m | 4.50 m | 4.46 m |
| d, e | 6.70 d 7.41 d | 6.66 d 7.61 d | 6.66 d 7.41 d | 6.63 d 7.35 d | 6.65 d 7.37 d | 8.05 s | 7.00 s |
| h | — | — | — | — | 2.76 | — | — |
| i | — | — | — | — | 1.79 | — | — |
| j | — | — | — | — | 3.43 | — | — |
| α | 8.40 s | 7.43 d | 7.06 d | 6.84 6.78 d | 6.84 s | 8.27 s | 6.98 d |
| β | — | 8.20 d | 8.12 d | 8.08 d | 8.05 s | — | 8.10 d |
| γ | — | 8.44 dd | 6.96 dd | 6.78 dd | — | — | 6.92 dd |
| δ | — | — | 8.06 dd | 7.99 dd | — | — | 8.01 dd |
| ε | — | — | 7.31 dd | 6.96 dd | 7.19 s | — | 7.31 dd |
| ζ | — | — | — | 7.24 dd | — | — | — |
| η | — | — | — | 6.57 | — | — | — |

TABLE 3

| Example | Compound | Absorption maximum (nm) |
|---|---|---|
| 1 | BTB-E-D1 | 502 |
| 2 | BTB-E-D2 | 580 |
| 3 | BTB-E-D3 | 635 |
| 4 | BTB-E-D4 | 637 |
| 5 | BTB-E-D3-Anc | 630 |

TABLE 3-continued

| Example | Compound | Absorption maximum (nm) |
|---|---|---|
| 6 | BTB-J-D1 | 522 |
| 7 | BTB-J-D3 | 680 |

What is claimed is:

1. A visible light sensitizer for a photopolymerizing initiator and/or a photocrosslinking agent which comprises a thiobarbituric acid derivative compound of the general formula (A) or (B):

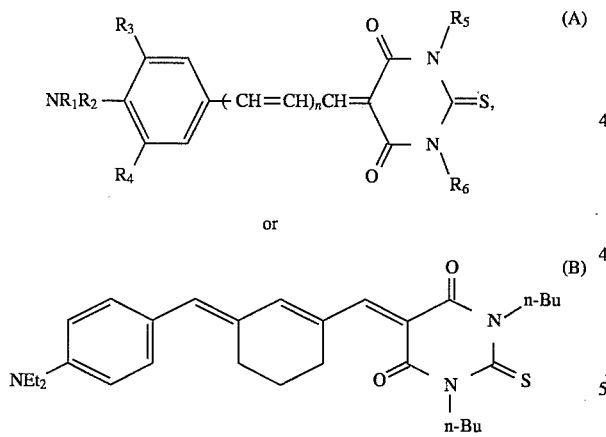

wherein each of $R_1$ and $R_2$ is alkyl having 1 to 6 carbon atoms; each of $R_3$ and $R_4$ is hydrogen or alkyl having 1 to 6 carbon atoms; and $R_1$ and $R_3$ or $R_2$ and $R_4$ may be bonded to each other to form a five-, six- or seven-membered heterocycle; each of $R_5$ and $R_6$ is independently a long-chain alkyl group having 2 or more carbon atoms; and n is an integer of 2 to 3.

2. The visible light sensitizer for a photopolymerizing initiator and/or a photocrosslinking agent according to claim 1, wherein the thiobarbituric acid derivative compound represented by the general formula (A) is selected from the group consisting of compounds of the formulae:

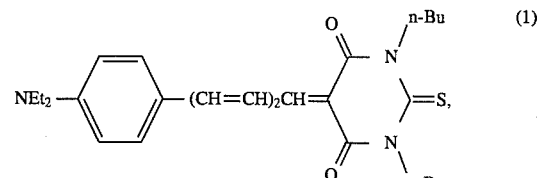

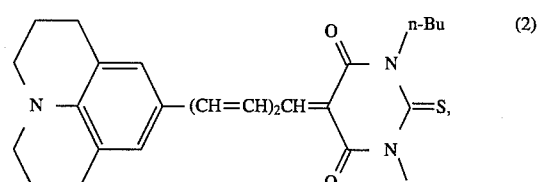

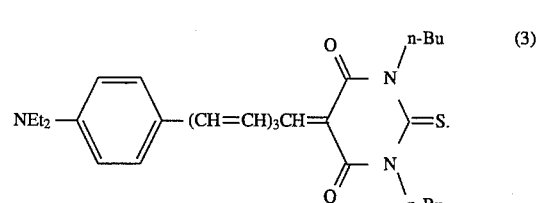

3. A photocrosslinkable composition which comprises a visible light sensitizer for a photocrosslinking agent comprising a thiobarbituric acid derivative compound represented by the following general formula (A) or (B), at least one crosslinking agent which can be activated by the irradiation of the active rays, and a photocrosslinkable resin:

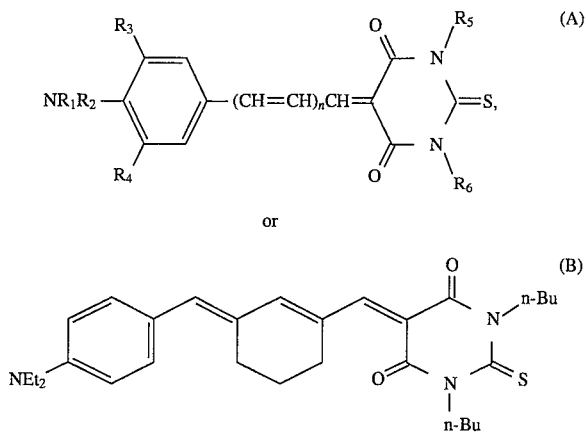

wherein each of $R_1$ and $R_2$ is alkyl having 1 to 6 carbon atoms each of $R_3$ and $R_4$ is hydrogen or alkyl having 1 to 6 carbon atoms and $R_1$ and $R_3$ or $R_2$ and $R_4$ may be bonded to each other to form a five-, six- or seven-membered heterocycle; each of $R_5$ and $R_6$ is independently a long-chain alkyl group having 2 or more carbon atoms; and n is an integer of 2 or 3.

4. The photocrosslinkable composition according to claim 3, wherein the thiobarbituric acid derivative compound represented by the general formula (A) is selected from the group consisting of compounds of the formulae:

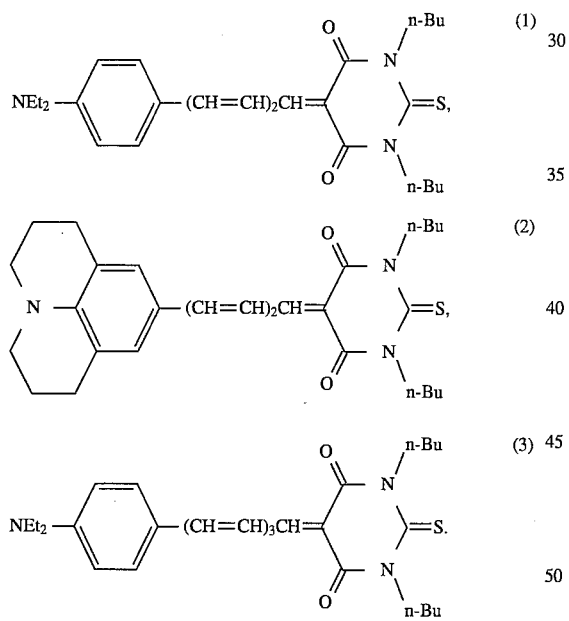

5. The photocrosslinkable composition according to claim 3, wherein the crosslinking agent which can be activated by the irradiation of the active rays is a compound having an electron accepting group.

6. The photocrosslinkable composition according to claim 3, wherein the crosslinking agent is selected from the group consisting of diarylhalonium salts, halomethyl-s-triazines, halogen compounds, bisimidazole derivatives and organic peroxides.

7. The photocrosslinkable composition according to claim 3, wherein said photocrosslinkable resin is selected from the group consisting of polyvinylcarbazole, poly(3-chlorovinyl-carbazole), poly(3-bromovinylcarbazole), poly(3-iodovinyl-carbazole), poly(3-methylvinylcarbazole), poly(3-ethylvi-nylcarbazole), chlorinated polyvinylcarbazole and brominated polyvinylcarbazole.

8. The photocrosslinkable composition according to claim 3, wherein said photocrosslinkable resin is selected from the group consisting of polystyrene having halogen, amino group, dimethylamino group or methoxy group at the para-position, poly(N-vinylindole), poly(N-vinylpyrrole), poly(N-vinlyphenothiazine), poly(isopropenylphenol), and poly[4-(N,N-diphenylamino)-phenylmethyl methacrylate].

9. A hologram recording medium which mainly comprises a photocrosslinkable composition comprising a visible light sensitizer for a photocrosslinking agent which comprises a thiobarbituric acid derivative compound represented by the following general formula (A) or (B), at least one crosslinking agent which can be activated by the irradiation of active rays, and a photocrosslinkable resin:

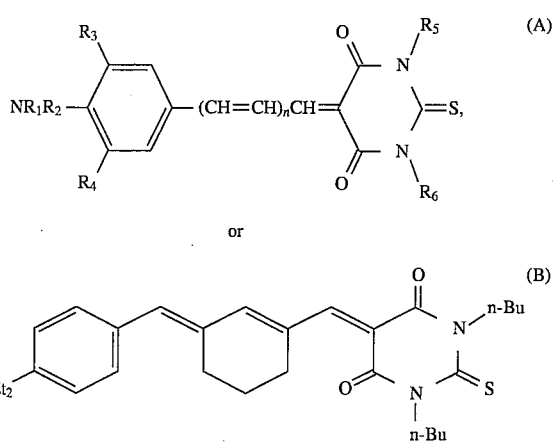

wherein each of $R_1$ and $R_2$ is alkyl having 1 to 6 carbon atoms; each of $R_3$ and $R_4$ is hydrogen or alkyl having 1 to 6 carbon atoms; and $R_1$ and $R_3$ or $R_2$ and $R_4$ may be bonded to each other to form a five-, six- or seven-membered heterocycle; each of $R_5$ and $R_6$ is independently a long-chain alkyl group having 2 or more carbon atoms; and n is an integer of 2 or 3.

10. The hologram recording medium according to claim 9, wherein the thiobarbituric acid derivative compound represented by the general formula (A) is selected from the group consisting of compounds of the formulae:

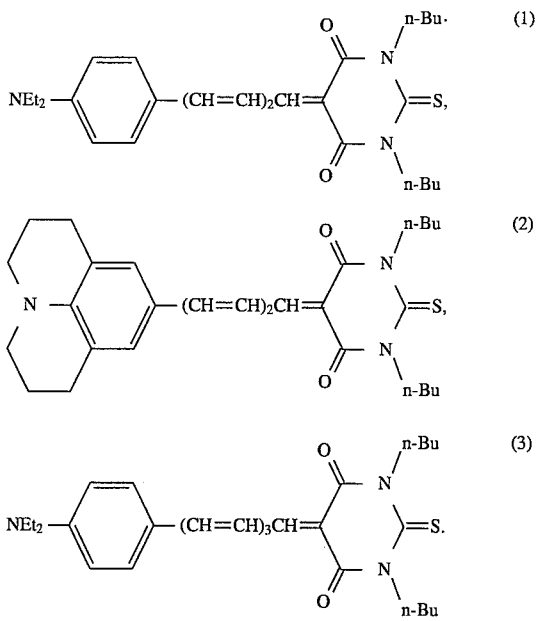

11. The hologram recording medium according to claim 9, wherein multiple-wavelength recording is possible.

12. The hologram recording medium according to claim 9, wherein the crosslinking agent which can be activated by the irradiation of the active rays is a compound having an electron accepting group.

13. The hologram recording medium according to claim 9, wherein the crosslinking agent is selected from the group consisting of diaryihalonium salts, halomethyl-s-triazines, halogen compounds, bisimidazole derivatives and organic peroxides.

14. The hologram recording medium according to claim 9, wherein said photocrosslinkable resin includes polyvinylcarbazole, poly(3-chlorovinylcarbazole), poly(3-bromovinylcarbazole), poly(3-iodovinylcarbazole), poly(3-methylvinylcarbazole), poly(3-ethylvinylcarbazole), chlorinated polyvinylcarbazole and brominated polyvinylcarbazole.

15. The hologram recording medium according to claim 9, wherein said photocrosslinkable resin includes polystyrene having halogen, amino group, dimethylamino group or methoxy group at the para-position, poly(N-vinylindole), poly(N-vinylpyrrole), poly(N-vinlyphenothiazine), poly(isopropenylphenol), and poly[4-(N,N-diphenylamino)phenylmethyl methacrylate].

* * * * *

UNITED STATES PATENT AND TRADEMARK OFFICE
CERTIFICATE OF CORRECTION

PATENT NO. : 5,618,856      Page 1 of 3
DATED : April 8, 1997
INVENTOR(S) : YOKO YOSHINAGA, ET AL.

It is certified that error appears in the above-identified patent and that said Letters Patent is hereby corrected as shown below:

ON THE COVER PAGE

At Item [56] "References Cited",
        "6324615 11/1994 Japan
         6329654 11/1994 Japan" should read
      --6-324615 11/1994 Japan
        6-329654 11/1994 Japan--.

COLUMN 3

Line 41, "Six-" should read --six- --.

COLUMN 10

Line 47, "in,the" should read --in the--.

COLUMN 15

Line 19, "Door" should read --poor--.

UNITED STATES PATENT AND TRADEMARK OFFICE
CERTIFICATE OF CORRECTION

PATENT NO. : 5,618,856     Page 2 of 3
DATED : April 8, 1997
INVENTOR(S) : YOKO YOSHINAGA, ET AL.

It is certified that error appears in the above-identified patent and that said Letters Patent is hereby corrected as shown below:

COLUMN 17

Line 10, "100 mJ/cm$^2$," should read -- 100 mJ/cm$^2$.--.

COLUMN 21

Line 58, "to" should read --or--.

COLUMN 22

Line 48, insert --and--.

COLUMN 23

Line 19, "atoms" should read --atoms;--,
Line 20, "atoms" should read --atoms;--,
Line 44, insert --and--.

UNITED STATES PATENT AND TRADEMARK OFFICE
CERTIFICATE OF CORRECTION

PATENT NO. : 5,618,856
DATED : April 8, 1997
INVENTOR(S) : YOKO YOSHINAGA, ET AL.

It is certified that error appears in the above-identified patent and that said Letters Patent is hereby corrected as shown below:

COLUMN 24

Line 57, insert --and--.

COLUMN 25

Line 7, "diaryihalonium" should read --diarylhalonium--.

COLUMN 26

Line 9, "diphenylamino)phe-" should read --diphenylamino)-phe- --.

Signed and Sealed this

Eighteenth Day of November 1997

Attest:

BRUCE LEHMAN

Attesting Officer

Commissioner of Patents and Trademarks